(12) United States Patent
Okada et al.

(10) Patent No.: US 11,122,679 B2
(45) Date of Patent: Sep. 14, 2021

(54) PRINTED CIRCUIT BOARD

(71) Applicant: SAMSUNG ELECTRO-MECHANICS CO., LTD., Suwon-si (KR)

(72) Inventors: Hiroki Okada, Suwon-si (KR); Hee Jung Jung, Suwon-si (KR)

(73) Assignee: SAMSUNG ELECTRO-MECHANICS CO., LTD., Suwon-si (KR)

( * ) Notice: Subject to any disclaimer, the term of this patent is extended or adjusted under 35 U.S.C. 154(b) by 65 days.

(21) Appl. No.: 16/809,932

(22) Filed: Mar. 5, 2020

(65) Prior Publication Data

US 2021/0212198 A1 Jul. 8, 2021

(30) Foreign Application Priority Data

Jan. 6, 2020 (KR) .................. 10-2020-0001423

(51) Int. Cl.
*H05K 1/11* (2006.01)
*H05K 1/02* (2006.01)
*H05K 1/05* (2006.01)

(52) U.S. Cl.
CPC ......... *H05K 1/0233* (2013.01); *H05K 1/0222* (2013.01); *H05K 1/05* (2013.01); *H05K 1/11* (2013.01); *H05K 2201/0129* (2013.01); *H05K 2201/0141* (2013.01); *H05K 2201/0269* (2013.01); *H05K 2201/0344* (2013.01); *H05K 2201/0358* (2013.01); *H05K 2201/08* (2013.01)

(58) Field of Classification Search
CPC .......... H05K 1/11–119; H05K 1/0222; H05K 1/0233
See application file for complete search history.

(56) References Cited

U.S. PATENT DOCUMENTS

| | | |
|---|---|---|
| 2007/0205847 A1 | 9/2007 | Kushta et al. |
| 2012/0119853 A1 | 5/2012 | Kushta |

FOREIGN PATENT DOCUMENTS

| | | |
|---|---|---|
| JP | 4991296 B2 | 8/2012 |
| JP | 5354231 B2 | 11/2013 |

*Primary Examiner* — Jeremy C Norris
(74) *Attorney, Agent, or Firm* — Morgan, Lewis & Bockius LLP

(57) ABSTRACT

A printed circuit board includes an insulating body, a wiring structure at least disposed on the insulating body; and a shielding portion including a conductive via disposed around the wiring structure of the insulating body. The conductive via includes first and second metal layers having different degrees of magnetic permeability.

18 Claims, 7 Drawing Sheets

(a)

(b)

PRINTED CIRCUIT BOARD

CROSS-REFERENCE TO RELATED APPLICATION(S)

This application claims benefit of priority to Korean Patent Application No. 10-2020-0001423 filed on Jan. 6, 2020 in the Korean Intellectual Property Office, the disclosure of which is incorporated herein by reference in its entirety.

TECHNICAL FIELD

The present disclosure relates to a printed circuit board.

BACKGROUND

As a trend of lightening and miniaturization of portable mobiles and electronic devices for display is rapidly increasing, the speed of signal transmission between components in such device has increased, and as a circuit board becomes a high-density microcircuit, damage from electromagnetic interference (EMI) due to the occurrence of electromagnetic noise between adjacent circuits is increasing.

SUMMARY

An aspect of the present disclosure is to provide a printed circuit board capable of improving a signal interference phenomenon due to the occurrence of electromagnetic noise.

According to an aspect of the present disclosure, a conductive via for shielding electromagnetic waves using a plurality of metal layers having different degrees of magnetic permeability may be formed.

According to an aspect of the present disclosure, a printed circuit board includes an insulating body; a wiring structure at least disposed in the insulating body; and a shielding portion including a conductive via disposed around the wiring structure of the insulating body. The conductive via may include first and second metal layers having different degrees of magnetic permeability.

BRIEF DESCRIPTION OF DRAWINGS

The above and other aspects, features, and advantages of the present disclosure will be more clearly understood from the following detailed description taken in conjunction with the accompanying drawings, in which.

DETAILED DESCRIPTION

Figure 1:
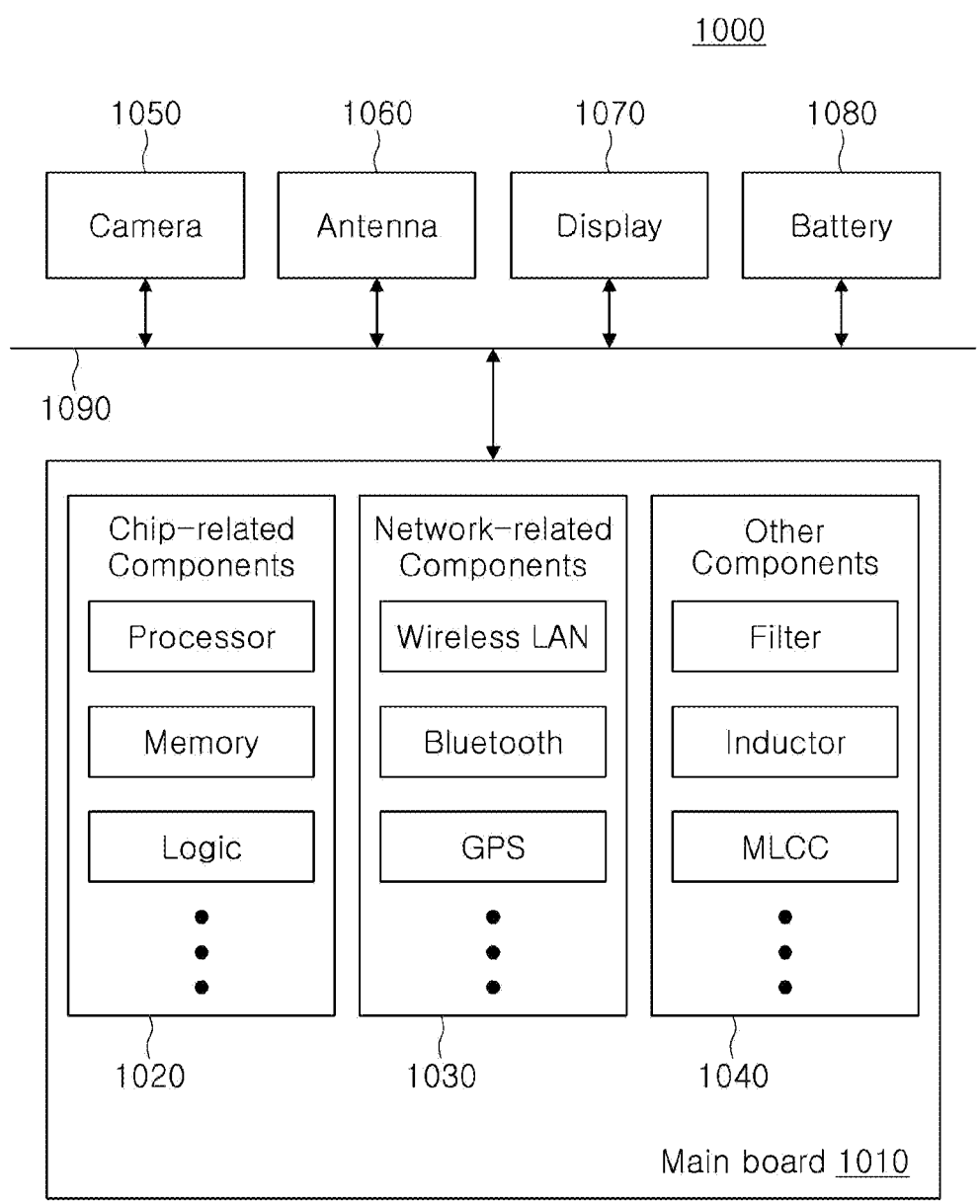
FIG. 1 is a schematic block diagram illustrating an example of an electronic device system.

Hereinafter, the present disclosure will be described with reference to the accompanying drawings. Shapes and dimensions of the elements in the drawings may be exaggerated or reduced for greater clarity of description.

FIG. 1 is a schematic block diagram illustrating an example of an electronic device system.

Referring to FIG. 1, an electronic device 1000 may accommodate a main board 1010. The main board 1010 may include chip-related components 1020, network-related components 1030, other components 1040, or the like, physically or electrically connected thereto. These components may be connected to others to be described below to form various signal lines 1090.

The chip-related components 1020 may include a memory chip such as a volatile memory (for example, a dynamic random access memory (DRAM)), a non-volatile memory (for example, a read only memory (ROM)), a flash memory, or the like; an application processor chip such as a central processor (for example, a central processing unit (CPU)), a graphics processor (for example, a graphics processing unit (GPU)), a digital signal processor, a cryptographic processor, a microprocessor, a microcontroller, or the like; and a logic chip such as an analog-to-digital converter, an application-specific integrated circuit (ASIC), or the like, or the like. However, the chip-related components 1020 are not limited thereto, and may include other types of chip-related components. In addition, the chip-related components 1020 may be combined with each other.

The network-related components 1030 may include protocols such as wireless fidelity (Wi-Fi) (Institute of Electrical And Electronics Engineers (IEEE) 802.11 family, or the like), worldwide interoperability for microwave access (WiMAX) (IEEE 802.16 family, or the like), IEEE 802.20, long term evolution (LTE), evolution data only (Ev-DO), high speed packet access+(HSPA+), high speed downlink packet access+(HSDPA+), high speed uplink packet access+(HSUPA+), enhanced data GSM environment (EDGE), global system for mobile communications (GSM), global positioning system (GPS), general packet radio service (GPRS), code division multiple access (CDMA), time division multiple access (TDMA), digital enhanced cordless telecommunications (DECT), Bluetooth®, 3G, 4G, and 5G protocols, and any other wireless and wired protocols, designated after the abovementioned protocols. However, the network-related components 1030 are not limited thereto, and may also include a variety of other wireless or wired standards or protocols. In addition, the network-related components 1030 may be combined with each other, together with the chip-related components 1020 described above.

Other components 1040 may include a high frequency inductor, a ferrite inductor, a power inductor, ferrite beads, a low temperature co-fired ceramic (LTCC), an electromagnetic interference (EMI) filter, a multilayer ceramic capacitor (MLCC), or the like. However, other components 1040 are not limited thereto, and may also include passive components used for various other purposes, or the like. In addition, other components 1040 may be combined with each other, together with the chip-related components 1020 or the network-related components 1030 described above.

Depending on a type of the electronic device 1000, the electronic device 1000 includes other components that may or may not be physically or electrically connected to the main board 1010. These other components may include, for example, a camera 1050, an antenna 1060, a display 1070, a battery 1080, an audio codec (not illustrated), a video codec (not illustrated), a power amplifier (not illustrated), a compass (not illustrated), an accelerometer (not illustrated), a gyroscope (not illustrated), a speaker (not illustrated), a mass storage unit (for example, a hard disk drive) (not illustrated), a compact disk (CD) drive (not illustrated), a digital versatile disk (DVD) drive (not illustrated), or the like. However, these other components are not limited thereto, but may also include other components used for various purposes depending on a type of electronic device 1000, or the like.

The electronic device 1000 may be a smartphone, a personal digital assistant (PDA), a digital video camera, a digital still camera, a network system, a computer, a monitor, a tablet PC, a laptop PC, a netbook PC, a television, a video game machine, a smartwatch, an automotive component, or the like. However, the electronic device 1000 is not limited thereto, and may be any other electronic device able to process data.

Figure 2:
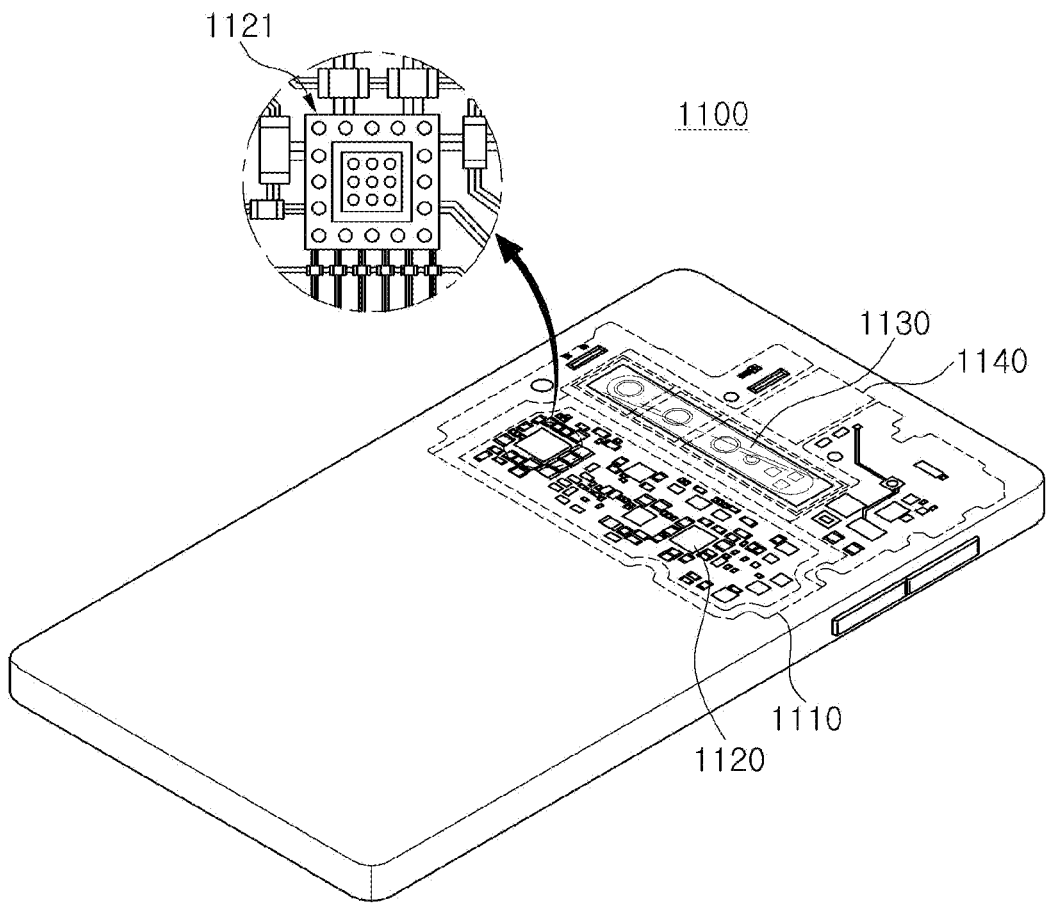
FIG. 2 is a schematic perspective view illustrating an example of an electronic device.

FIG. 2 is a schematic perspective view illustrating an example of an electronic device.

Referring to FIG. 2, an electronic device may be, for example, a smartphone 1100. A main board 1110 may be accommodated in the smartphone 1100, and various electronic components 1120 may be physically and/or electrically connected to the main board 1110. In addition, other electronic components, such as a camera module 1130 and/or a speaker 1140, which may or may not be physically and/or electrically connected to the main board 1110 may be accommodated therein. A portion of the electronic components 1120 may be the above-described chip related components, for example, a semiconductor package 1121, but are not limited thereto. The semiconductor package 1121 may be a surface in which a semiconductor chip or a passive component is mounted on a package substrate in a package substrate form, but is not limited thereto. An antenna may be applied to the smartphone 1100. For example, the antenna may be applied in a form of an antenna module, and the antenna module may be configured such that a wireless communication integrated circuit is mounted on an antenna substrate including an antenna pattern and a feed pattern. Alternatively, the antenna module may be configured such that a chip antenna and a wireless communication integrated circuit are mounted on an antenna substrate including a feed pattern, respectively. The antenna substrate may be a multilayer printed circuit board. By applying the antenna module in the smartphone 1100, radiation R' of an antenna signal may be performed in various directions. Meanwhile, the electronic device to which the antenna is applied is not limited to the smartphone 1100. For example, in addition to the smartphone 1100, the electronic device may be other kinds of electronic devices as described above.

Figure 3:
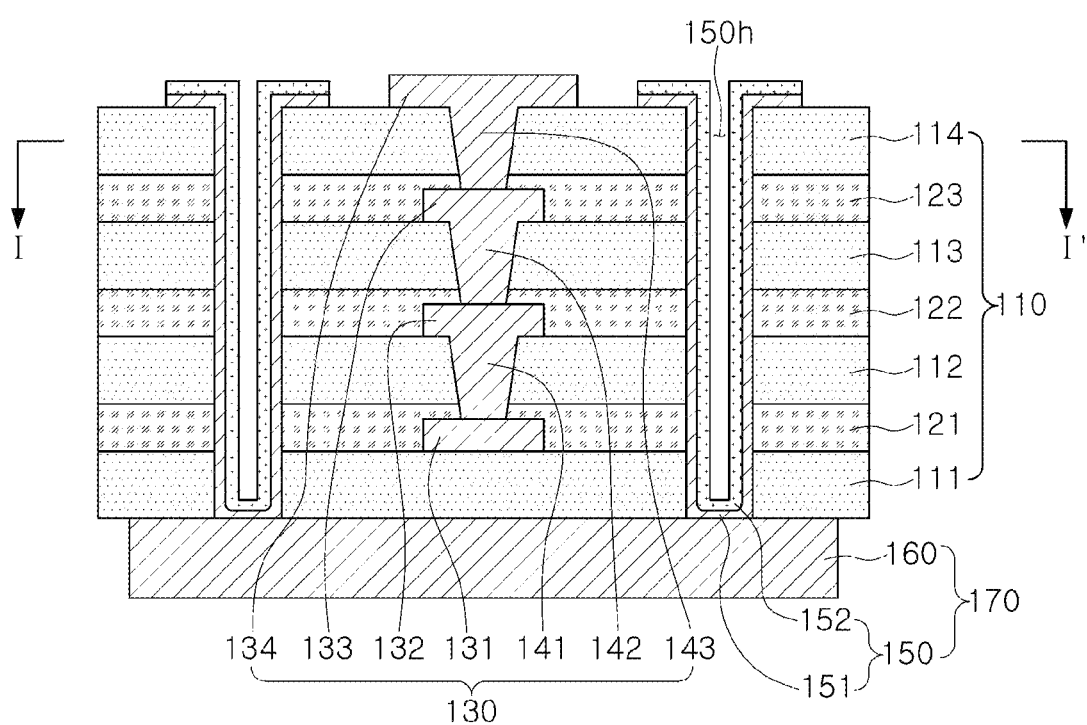
FIG. 3 is a schematic cross-sectional view illustrating an example of a printed circuit board.

FIG. 3 is a schematic cross-sectional view illustrating an example of a printed circuit board.

Figure 4:
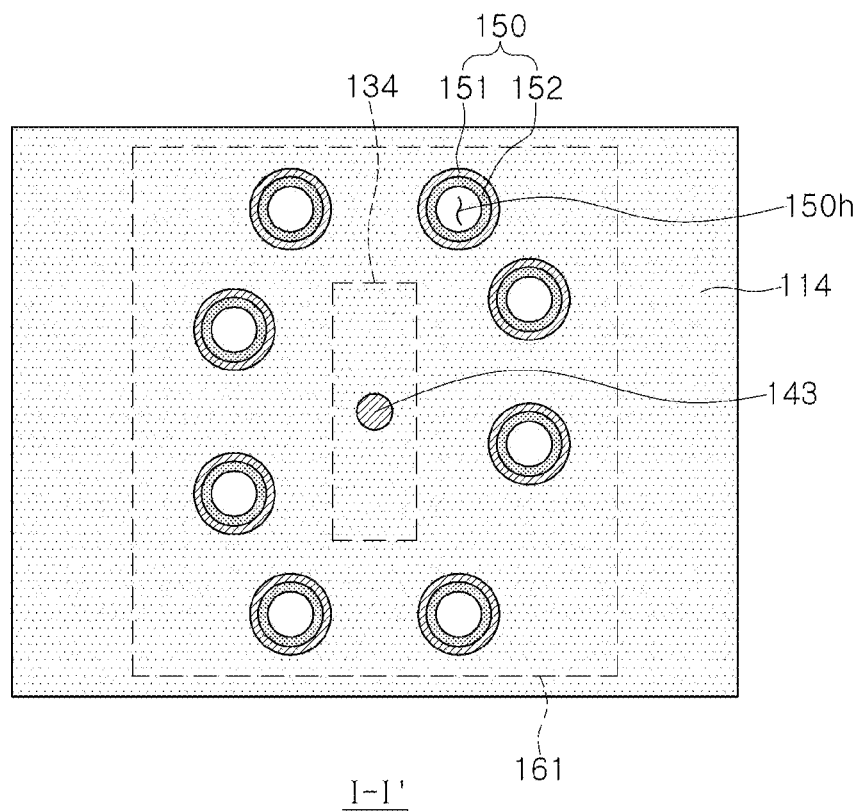
FIG. 4 is a schematic cross-sectional view taken along line I-I' of the printed circuit board of FIG. 3.

FIG. 4 is a schematic cross-sectional view taken along line I-I' of the printed circuit board of FIG. 3.

Referring to FIGS. 3 and 4, a printed circuit board 100A according to an example includes an insulating body 110, a wiring structure 130 disposed on the insulating body 110, and a shielding portion 170 disposed on the insulating body. The shielding portion 170 includes one or more conductive vias 150. For example, the shielding portion 170 may include a plurality of conductive vias 150, and in this case, the conductive vias 150 may be disposed to be spaced apart from each other around the wiring structure 130. The conductive vias 150 include a first metal layer 151 and a second metal layer 152 having different degrees of magnetic permeability. For example, the second metal layer 152 may include a metal having higher magnetic permeability than the first metal layer 151. The wiring structure 130 may be a signal portion for transmitting signals.

Meanwhile, damages to a signal interference phenomenon due to the occurrence of electromagnetic noise between adjacent circuits have been recently increased, and accordingly, it is required to improve the signal interference phenomenon due to the occurrence of the electromagnetic noise. For example, electromagnetic shielding has emerged as an important issue in 5G antenna substrates, or the like that transmit and receive high-frequency signals. To improve this, for example, it may be considered to dispose a plurality of conductive vias around a signal circuit. It is because the electromagnetic noise may be removed by reflection by a shielding layer including a metal or absorption in the shielding layer and attenuation. As a material of the conductive via, a metal generally used in a plating process, for example, copper (Cu) may be used. Meanwhile, a reduction of noise due to absorption increases the thicker the shielding layer, the higher the conductivity, and the higher the magnetic permeability. However, copper (Cu) has a relatively low magnetic permeability, so that the shielding layer may have a relatively thick thickness to have a sufficient noise reduction effect. In this case, the size of the conductive via may be increased, and thus may be subject to design constraints.

On the other hand, in the printed circuit board 100A according to an example, a conductive via 150 may be disposed around the wiring structure 130, but the conductive via 150 may include a first metal layer 151 and a second metal layer 152 having different degrees of magnetic permeability. For example, the second metal layer 152 may include a metal having magnetic permeability higher than that of the first metal layer 151. For example, as a non-limiting example, the first metal layer 151 may include copper (Cu), and the second metal layer 152 may include an alloy including iron (Fe) and nickel (Ni). Since iron (Fe) and nickel (Ni) have magnetic permeability that is of several hundred to several thousand times greater as compared with copper (Cu), the conductive via 150 including the first metal layer 151 and the second metal layer 152 of this combination may have an excellent noise reduction effect even with a thickness thinner than the conductive via simply including a metal layer including copper (Cu). Accordingly, the size of the conductive via 150 may be reduced, and as a result, a larger number of conductive vias 150 may be easily formed around the wiring structure 130. Therefore, design flexibility may be improved, and a better noise reduction effect may be obtained. In addition, the conductive via 150 does not simply include the second metal layer 152 having high magnetic permeability, but also includes the first metal layer 151 having low magnetic permeability, the conductive via 150 may have effects capable of having through first metal layer 151 in addition to the magnetic permeability, for example, additional effects such as ease of plating, cost reduction, process simplification, and/or reliability improvement, or the like.

Hereinafter, components of the printed circuit board 100A according to an example will be described in more detail with reference to the accompanying drawings.

An insulating body 110 may provide an insulating region. The insulating body 110 may include a plurality of insulating layers 111, 112, 113, 114, 121, 122, and 123. Each of the insulating layers 111, 112, 113, 114, 121, 122, and 123 may include an insulating material, and in this case, the insulating material may include various materials including a thermosetting resin, a thermoplastic resin, or a material including a reinforcing material such as glass fiber (or glass cloth, glass fabric) and/or an inorganic filler. If necessary, the insulating body 110 may include a laminate including a plurality of thermoplastic resin layers 111, 112, 113, and 114 and a plurality of thermosetting resin layers 121, 122, and 123. For example, the insulating body 110 may include a first thermoplastic resin layer 111, a first thermosetting resin layer 121 disposed on the first thermoplastic resin layer 111, a second thermoplastic resin layer 112 disposed on the first thermosetting resin layer 121, a second thermosetting resin layer 122 disposed on the second thermoplastic resin layer 112, and a third thermoplastic resin layer 113 disposed on the second thermosetting resin layer 122. The plurality of thermoplastic resin layers 111, 112, 113, and 114 and the plurality of thermosetting resin layers 121, 212, and 123 may be alternately stacked in an up-and-down direction.

As the thermoplastic resin layers 111, 112, 113, and 114, for example, a liquid crystal polymer (LCP), a polytetrafluoroethylene (PTFE), a polyphenylene sulfide (PPS), a polyphenylene ether (PPE), a polyimide (PI), and the like, in terms of high-frequency signal transmission, may be used. A dielectric dissipation factor Df may be adjusted according to a kind of resins of the thermoplastic resin layers 111, 112, 113, and 114, a kind of fillers contained in resins, a content of fillers, and the like. Here, the dielectric dissipation factor is a value for a dielectric loss, the dielectric loss may mean loss power generated when an alternating electric field is formed in a resin layer (dielectric). The dielectric dissipation factor is proportional to a dielectric loss, and the lower the dielectric dissipation factor is, the lower the dielectric loss is. The thermoplastic layers 111, 112, 113, and 114 having low dielectric loss characteristics have advantageous in terms of loss reduction in high-frequency signal transmission. The dielectric dissipation factor of the thermoplastic resin layers 111, 112, 113, and 114 may be 0.003 or less, respectively, for example, 0.002 or less. In addition, the dielectric constant Dk of the thermoplastic resin layers 111, 112, 113, and 114 may be 3.5 or less, respectively. In one example, the thermoplastic resin layers 111, 112, 113, and 114 may be made of the same material.

As the thermosetting resin layers 121, 122, and 123, for example, in terms of high frequency signal transmission, polyphenylene ether (PPE), modified polyimide (PI), modified epoxy (Epoxy), and the like, may be used. The dielectric dissipation factor may be adjusted according to the kind of resin of the thermosetting resin layers 121, 122, 123, the kind of filler contained in the resin, the content of the filler, and the like. Here, the dielectric dissipation factor is a value for a dielectric loss, and the dielectric loss may mean a loss power generated when an alternating electric field is formed in the resin layer (dielectric). The dielectric dissipation factor is proportional to the dielectric loss, and the lower the dielectric dissipation factor is, the lower the dielectric loss is. The thermosetting resin layers 121, 122, and 123 having low dielectric loss may be advantageous in terms of loss reduction in high-frequency signal transmission. The dielectric dissipation factor of the thermosetting resin layers 121, 122, and 123 may be 0.003 or less, respectively, for example, may be 0.002 or less. In addition, the dielectric constants of the thermosetting resin layers 121, 122, and 123 may be 3.5 or less, respectively. In one example, the thermosetting resin layers 121, 122, and 123 may be made of the same material.

The thickness of each of the thermoplastic resin layers 111, 112, 113, and 114 may be greater than the thickness of each of the thermosetting resin layers 121, 122, and 123. In terms of high-frequency signal transmission, it may be more desirable to have such a thickness relationship. An interface between the thermoplastic resin layers 111, 112, 113, and 114 and the thermosetting resin layers 121, 122, and 123, which are vertically adjacent, may include a roughness surface. The roughness surface may mean a surface which has been roughened and has an unevenness. The roughness surface may mean a surface which has been roughened and has an unevenness. Each of the thermoplastic resin layers 111, 112, 113, and 114 may have a higher dielectric dissipation factor than each of the thermosetting resin layers 121, 122, and 123. By selecting a combination of these materials, it is possible to more effectively improve a signal transmission loss in a high frequency region.

A wiring structure 130 may include plurality of circuit layers 131, 132, 133, and 134 and a plurality of via layers 141, 142, and 143 connecting the plurality of circuit layers 131, 132, 133, and 134 in an up-and-down direction. For example, the wiring structure 130 may include a first circuit layer 131 disposed on the first thermoplastic resin layer 111 and embedded in the first thermosetting resin layer 121, a second circuit layer 132 disposed on the second thermoplastic resin layer 112 and embedded in the second thermosetting resin layer 122, a third circuit layer 133 disposed on the third thermoplastic resin layer 113 and embedded in the third thermosetting resin layer 123, a fourth circuit layer 134 disposed on the fourth thermoplastic resin layer 113, a first via layer 141 penetrating the first thermosetting resin layer 121 and the second thermoplastic resin layer 112 and connecting the first and second circuit layers 131 and 132, a second via layer 142 penetrating the second thermosetting resin layer 122 and the third thermoplastic resin layer 113 and connecting the second and third circuit layers 132 and 133, and a third via layer 143 penetrating the third thermosetting resin layer 123 and the fourth thermoplastic resin layer 114 and connecting the third and fourth circuit layers 133 and 134. The circuit layers 131, 132, 133, and 134 may protrude on the thermoplastic resin layers 111, 112, 113, and 114, respectively. The circuit layers 131, 132, and 133 of the circuit layers 131, 132, 133, and 134, which are embedded in the insulating body 110, may be embedded in the thermosetting resin layers 121, 122, and 123, respectively. The via layers 141, 142, and 143 may simultaneously penetrate the thermoplastic resin layers 111, 112, 113, and 114 and the thermosetting resin layers 121, 122, and 123, which are adjacent, respectively.

A metal material may be used of a material of the circuit layers 131, 132, 133, and 134, and in this case as the metal material, copper (Cu), aluminum (Al), silver (Ag), tin (Sn), gold (Au), Nickel (Ni), lead (Pb), titanium (Ti), alloys thereof, or the like may be used. The circuit layers 131, 132, 133, and 134 may be formed by a plating process, for example, an additive process (AP), a semi AP (SAP), a modified SAP (MSAP), a TT (Tenting), or the like, respectively, and as a result, the circuit layers 131, 132, 133, and 134 may include a seed layer, an electroless plating layer and an electrolytic plating layer, formed based on the seed layer. The circuit layers 131, 132, 133, and 134 may perform various functions due to the design the corresponding layer. For example, the circuit layers 131, 132, 133, and 134 may include an antenna pattern, a signal pattern, a ground pattern, a power pattern, and the like. Here, the signal pattern may include a pattern for various signals except for the antenna pattern, the ground pattern, and the power pattern, for example, a feed pattern. These patterns of the circuit layers 131, 132, 133, and 134 may include a line pattern, a plane pattern, and/or a pad pattern, respectively.

A metal material may also be used as a material of the via layers 141, 142, and 143, and in this case, as the metal material, copper (Cu), aluminum (Al), silver (Ag), tin (Sn), gold (Au), Nickel (Ni), lead (Pb), titanium (Ti), alloys thereof, or the like may be used. The via layers 141, 142, and 143 may also be formed by a plating process such as AP, SAP, MAAP, TT, and the like, respectively, and as a result, the via layers 141, 142, and 143 may include a seed layer, an electroless plating layer, and an electrolytic plating layer, formed based on the seed layer. The via layers 141, 142, and 143 may perform various functions due to designs. For example, the via layers 141, 142, and 143 may include a connection via for antenna connection, a connection via for signal connection, a connection via for ground connection, a connection via for power connection, and the like. Here, the connection via for signal connection may include a connection via for connecting various signals except for the connection via for antenna connection, the connection via for ground connection, and the connection via for power connection, for example, a connection via for power feed. Each of the connection vias may be completely filled with a metal material, or the metal material may be formed along a wall surface of a via hole. In addition, each of the connection vias may have various shapes, such as tapered shape, or the like.

The shielding portion 170 may include one or more conductive vias 150 penetrating the first to third thermoplastic resin layers 111, 112, and 113 and the first and second thermosetting resin layers 121 and 122, for example, a plurality of conductive vias 150. The conductive via 150 may include a first metal layer 151 and a second metal layer 152 having different magnetic permeability. For example, the second metal layer 152 may include a metal having magnetic permeability, higher than that of the first metal layer 151. As a non-limiting example, the first metal layer 151 may include copper (Cu), and the second metal layer 152 may include an alloy including iron (Fe) and nickel (Ni), but is not limited thereto, and various metal combinations having different magnetic permeability may be applied thereto. The conductive via 150 may be a conformal via disposed along a wall surface of a via hole 150h penetrating at least a portion of the insulating body 110. For example, the conductive via 150 may include a first metal layer 151 disposed on the wall surface of the via hole 150h and a second metal layer 152 disposed on the first metal layer 151. In this case, the first metal layer 151 and the second metal layer 152 may doubly shield electromagnetic waves, respectively, on a path of the electromagnetic waves generated toward the wiring structure 130 or from the wiring structure 130 and flowing into the conductive via 150. As a result, electromagnetic waves may be multiply shielded in each conductive via 150, and thus may have an excellent electromagnetic shielding effect. The conductive via 150 may penetrate only a pair of adjacent thermoplastic resin layers 111, 112, 113, and 114 and the thermosetting resin layers 121, 122, and 123, and in this case, a plurality of conductive vias 150 may be disposed in an up-and-down direction in stacked-form with a pad pattern interposed therebetween. The conductive via 150 may have various shapes such as a cylindrical shape, a tapered shape, or the like.

The shielding portion 170 may further include a ground pattern 160. The ground pattern 160 may be disposed below the insulating body 110. However, the present disclosure is not limited thereto, and the ground pattern 160 may also be disposed in the insulating body 110, if necessary. The conductive via 150 may be connected to the ground pattern 160. For example, the conductive via 150 may function as a ground. The ground pattern 160 may be in a form of a ground plane blocking a lower side of the wiring structure 130. Thereby, the lower side of the wiring structure 130 may also have an electromagnetic shielding effect. The ground pattern 160 may include copper (Cu), aluminum (Al), silver (Ag), tin (Sn), gold (Au), nickel (Ni), lead (Pb), titanium (Ti), alloys thereof, or the like, and may be formed by a plating process such as AP, SAP, MSAP, TT, or the like. As a result, the ground pattern 160 may include a seed layer, an electroless plating layer, and an electrolytic plating layer, formed based on the seed layer, respectively.

Figure 5:
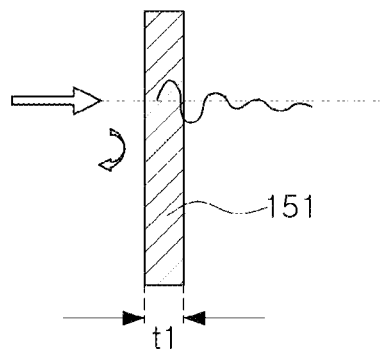
FIG. 5 is a schematic view illustrating an electromagnetic shielding effect according to a thickness of a first metal layer.
Figure 5:
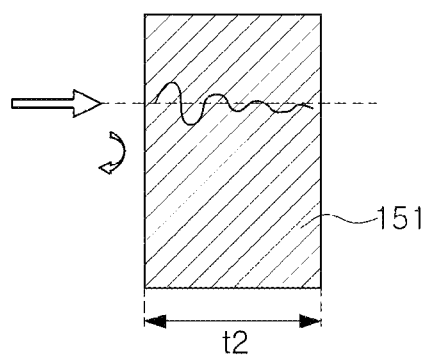

FIG. 5 is a schematic view illustrating an electromagnetic shielding effect according to a thickness of a first metal layer.

Referring to FIG. 5, as shown in (a), when the first metal layer 151 including a metal having relatively low magnetic permeability, such as copper (Cu) has a relatively thin thickness (t1), the first metal layer 151 may not have a sufficient electromagnetic wave noise absorption effect. However, as shown in (b), when the first metal layer 151 has a relatively thick thickness (t2), the first metal layer 151 may have a sufficient electromagnetic wave noise absorption effect. Thereby, it can be seen that a shielding layer including a metal having a relatively low magnetic permeability should be thick.

Figure 6:
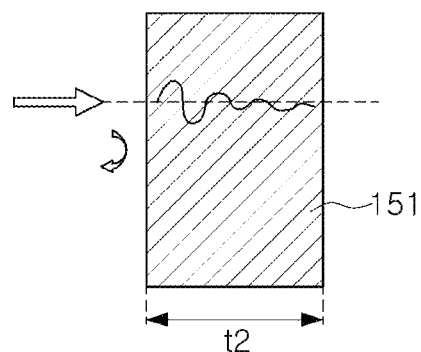
FIG. 6 is a schematic view illustrating a difference in an electromagnetic shielding effect between the first metal layer and the second metal layer.
Figure 6:
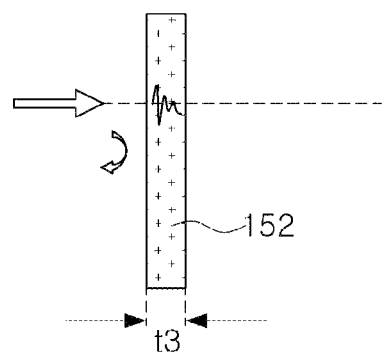

FIG. 6 is a schematic view illustrating a difference in an electromagnetic shielding effect between the first metal layer and the second metal layer.

Referring to FIG. 6, as shown in (a), the first metal layer 151 including a metal having a relatively low magnetic permeability, such as copper (Cu), may have a sufficient noise absorption electromagnetic wave effect when the first metal 151 has a relatively thick thickness (t2). On the other hand, as shown in (b), even when the second metal layer 152 including a metal having a relatively high magnetic permeability, such as an alloy including nickel (Ni) and iron (Fe), has a relatively thin thickness (t3), it can be seen that the second metal layer 152 can have a sufficient electromagnetic wave noise absorption effect. Thereby, it can be seen that a shielding layer containing the metal having a relatively high magnetic permeability may be thinner.

Figure 7:
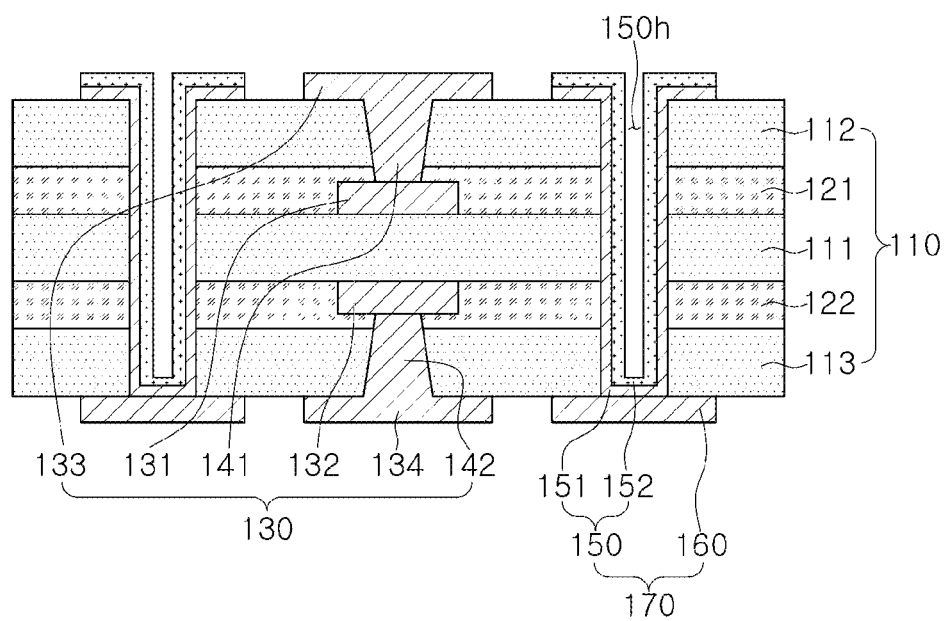
FIG. 7 is a schematic cross-sectional view illustrating another example of a printed circuit board.

FIG. 7 is a schematic cross-sectional view illustrating another example of a printed circuit board.

Referring to FIG. 7, in a printed circuit board 100B according to another example, an insulating body 110 may include a first thermoplastic resin layer 111, a first thermosetting resin layer 121 disposed on an upper surface of the first thermoplastic resin layer 111, a second thermosetting resin layer 122 disposed on a lower surface of the first thermoplastic resin layer 111, a second thermoplastic resin layer 112 disposed on an upper surface of the first thermosetting resin layer 121, and a third thermoplastic resin layer 113 disposed on a lower surface of the second thermosetting resin layer 122. In addition, the wiring structure 130 may include a first circuit layer 131 disposed on the upper surface of the first thermoplastic resin layer 111 and embedded in the first thermosetting resin layer 121, a second circuit layer 132 disposed on the lower surface of the first thermoplastic resin layer 111 and embedded in the second thermosetting resin layer 122, a third circuit layer 133 disposed on the upper surface of the second thermoplastic resin layer 112, a fourth circuit layer 134 disposed on the lower surface of the third thermoplastic resin layer 113, a first via layer penetrating the first thermosetting resin layer 121 and the second thermoplastic resin layer 112 and connecting the first and third circuit layers 131 and 133, and a second via layer 142 penetrating the second thermosetting resin layer 122 and the third thermoplastic resin layer 113 and connecting the second and fourth circuit layers 132 and 134. The shielding portion 170 may a plurality of conductive vias 150 penetrating the first to third thermoplastic resin layers 111, 112, and 113 and the first and second thermosetting resin layers 121 and 122. The shielding portion 170 may further include a ground pattern 160 connected to each of the conductive vias 150. Other contents are substantially the same as described above, and detailed descriptions thereof will be omitted.

As used herein, the terms "side portion," "side surface," and the like, are used to refer to a direction toward a first or second direction or a surface on said direction. The terms "upper side," "upper portion", "upper surface," and the like, are used to refer to a direction toward a third direction or a surface on said direction, while the terms "lower side," "lower portion," "lower surface," and the like, are used to refer to a direction opposing the direction toward the third direction or a surface on said direction. In addition, said spatially relative terms have been used as a concept including a case in which a target component is positioned in a corresponding direction, but does not directly contact a reference component, as well as a case in which the target component directly contacts the reference component in the corresponding direction. However, the terms may be defined as above for ease of description, and the scope of right of the exemplary embodiments is not particularly limited to the above terms.

As used herein, the term "connected" may not only refer to "directly connected" but also include "indirectly connected" by means of an adhesive layer, or the like. The term "electrically connected" may include both of the case in which constitutional elements are "physically connected" and the case in which constitutional elements are "not physically connected." Further, the terms "first," "second," and the like may be used to distinguish one constitutional element from the other, and may not limit a sequence and/or an importance, or others, in relation to the constitutional elements. In some cases, a first constitutional element may be referred to as a second constitutional element, and similarly, a second constitutional element may be referred to as a first constitutional element without departing from the scope of right of the exemplary embodiments.

As used herein, the term "an embodiment" is provided to emphasize a particular feature, structure, or characteristic, and do not necessarily refer to the same embodiment. Furthermore, the particular characteristics or features may be combined in any suitable manner in one or more embodiments. For example, a context described in a specific exemplary embodiment maybe used in other embodiments, even if it is not described in the other embodiments, unless it is described contrary to or inconsistent with the context in the other embodiments.

The terms used herein describe particular embodiments only, and the present disclosure is not limited thereby. As used herein, the singular forms "a," "an," and "the" are intended to include the plural forms as well, unless the context clearly indicates otherwise.

As set forth above, according to the present disclosure, a printed circuit board capable of improving a signal interference phenomenon due to electromagnetic noise may be provided.

While exemplary embodiments have been shown and described above, it will be apparent to those skilled in the art that modifications and variations could be made without departing from the scope of the present invention as defined by the appended claims.

What is claimed is:

1. A printed circuit board, comprising:
an insulating body;
a wiring structure at least disposed on the insulating body; and
a shielding portion including a conductive via disposed around the wiring structure of the insulating body,
wherein the conductive via comprises first and second metal layers having different degrees of magnetic permeability.

2. The printed circuit board of claim 1, wherein the conductive via is a conformal via disposed along a wall surface of a via hole penetrating at least a portion of the insulating body.

3. The printed circuit board of claim 1, wherein the first metal layer is disposed on a wall surface of a via hole,
the second metal layer is disposed on the first metal layer, and
the second metal layer comprises a metal having magnetic permeability higher than that of the first metal layer.

4. The printed circuit board of claim 3, wherein the first metal layer comprises copper (Cu), and
the second metal layer comprises an alloy containing iron (Fe) and nickel (Ni).

5. The printed circuit board of claim 1, wherein the shielding portion comprises a plurality of conductive vias, and
the plurality of conductive vias are disposed to be spaced apart from each other around the wiring structure.

6. The printed circuit board of claim 5, wherein the shielding portion further comprises a conductive pattern disposed on one side of the insulating body and connected to each of the plurality of conductive vias.

7. The printed circuit board of claim 1, wherein the shielding portion further comprises a ground pattern connected to the conductive via.

8. The printed circuit board of claim 1, wherein the insulating body comprises a laminate of thermosetting resin layer and thermoplastic resin layer.

9. The printed circuit board of claim 8, wherein the thermoplastic resin layer comprises a liquid crystal polymer (LCP).

10. The printed circuit board of claim 8, wherein the thermoplastic resin layer is thicker than the thermosetting resin layer.

11. The printed circuit board of claim 8, wherein the thermoplastic resin layer has a higher dielectric dissipation factor than the thermosetting resin layer.

12. The printed circuit board of claim 1, wherein the insulating body comprises a laminate including a plurality of thermosetting resin layers and a plurality of thermoplastic resin layers alternately stacked in a thickness direction of the printed circuit board.

13. The printed circuit board of claim 12, wherein the wiring structure comprises a plurality of circuit layers and one or more via layers connecting the plurality of circuit layers in the thickness direction, and
in a pair of a thermoplastic resin layer and a thermosetting resin layer among the laminate, which are vertically adjacent:
a first circuit layer of the plurality of circuit layers is embedded in the thermosetting resin layer of the pair,
a second circuit layer of the plurality of circuit layers protrudes on the thermoplastic resin layer of the pair, and
a first via layer of the one or more via layers penetrates the thermosetting resin layer and the thermoplastic resin layer to connect the first and second circuit layers.

14. The printed circuit board of claim 1, wherein the insulating body comprises a first thermoplastic resin layer, a first thermosetting resin layer disposed on the first thermoplastic resin layer, a second thermoplastic resin layer disposed on the first thermosetting resin layer, a second thermosetting resin layer disposed on the second thermoplastic resin layer, and a third thermoplastic resin layer disposed on the second thermosetting resin layer, the wiring structure comprises a first circuit layer disposed on the first thermoplastic resin layer and embedded in the first thermosetting resin layer, a second circuit layer disposed on the second thermoplastic resin layer and embedded in the second thermosetting resin layer, a third circuit layer disposed on the third thermoplastic resin layer, a first via layer penetrating the first thermosetting resin layer and the second thermoplastic resin layer and connecting the first and second circuit layers, and a second via layer penetrating the second thermosetting resin layer and the third thermoplastic resin layer and connecting the second and third circuit layers, and the shielding portion comprises the conductive via penetrating the first to third thermoplastic resin layers and the first and second thermosetting resin layers.

15. The printed circuit board of claim 14, wherein the first via layer and the second via layer are tapered a same direction.

16. The printed circuit board of claim 1, wherein the insulating body comprises a first thermoplastic resin layer, a first thermosetting resin layer disposed on an upper surface of the first thermoplastic resin layer, a second thermosetting resin layer disposed on a lower surface of the first thermoplastic resin layer, a second thermoplastic resin layer disposed on an upper surface of the first thermosetting resin layer, and a third thermoplastic resin layer disposed on a lower surface of the second thermosetting resin layer, the wiring structure comprises a first circuit layer disposed on the upper surface of the first thermoplastic resin layer and embedded in the first thermosetting resin layer, a second circuit layer disposed on the lower surface of the first thermoplastic resin layer and embedded in the second thermosetting resin layer, a third circuit layer disposed on an upper surface of the second thermoplastic resin layer, a fourth circuit layer disposed on a lower surface of the third thermoplastic resin layer, a first via layer penetrating the first thermosetting resin layer and the second thermoplastic resin layer and connecting the first and third circuit layers, and a second via layer penetrating the second thermosetting resin layer and the third thermoplastic resin layer and connecting the second and fourth circuit layers, and the shielding portion comprises the conductive via penetrating the first to third thermoplastic resin layers and the first and second thermosetting resin layers.

17. The printed circuit board of claim 16, wherein the first via layer and the second via layer are tapered in directions opposite to each other.

18. The printed circuit board of claim 16, wherein the first and second circuit layers are electrically insulated from each other.

* * * * *